US009261695B2

(12) United States Patent
Patra

(10) Patent No.: US 9,261,695 B2
(45) Date of Patent: Feb. 16, 2016

(54) ILLUMINATION SYSTEM OF A MICROLITHOGRAPHIC PROJECTION EXPOSURE APPARATUS

(71) Applicant: Carl Zeiss SMT GmbH, Oberkochen (DE)

(72) Inventor: Michael Patra, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 196 days.

(21) Appl. No.: 14/025,216

(22) Filed: Sep. 12, 2013

(65) Prior Publication Data

US 2015/0070671 A1 Mar. 12, 2015

Related U.S. Application Data

(63) Continuation of application No. PCT/EP2012/004212, filed on Oct. 8, 2012.

(51) Int. Cl.
*G03B 27/32* (2006.01)
*G03B 27/54* (2006.01)
(Continued)

(52) U.S. Cl.
CPC ........ *G02B 26/0833* (2013.01); *G03F 7/70075* (2013.01); *G03F 7/70116* (2013.01); *G03F 7/70291* (2013.01)

(58) Field of Classification Search
CPC ........ G02B 26/0833–26/0866; G03F 7/70075; G03F 7/70083; G03F 7/70091; G03F 7/70116; G03F 7/7015; G03F 7/70291; G03F 7/70508; G03F 7/70516; G03F 7/70558

USPC ....................................... 355/67, 77; 359/904
See application file for complete search history.

(56) References Cited

U.S. PATENT DOCUMENTS 7,061,582 B2 6/2006 Zinn et al.
2006/0087634 A1 4/2006 Brown et al.
(Continued)

FOREIGN PATENT DOCUMENTS

EP 1 262 836 12/2002
EP 1 975 724 A1 10/2008
(Continued)

OTHER PUBLICATIONS

International Search Report for corresponding PCT Appl No. PCT/EP2012/004212, dated Jun. 5, 2013.
(Continued)

*Primary Examiner* — Colin Kreutzer
(74) *Attorney, Agent, or Firm* — Fish & Richardson P.C.

(57) ABSTRACT

An illumination system of a microlithographic projection exposure apparatus comprises a spatial light modulator which is arranged between a light source and a pupil plane. The spatial light modulator includes an array of micromirrors or other light deflecting elements each being capable of individually deflecting impinging projection into various directions. An irradiance distribution on the mirror array or its envelope has, along a direction X an increasing slope and a decreasing slope. The control unit controls the mirrors in such a way that a first mirror, which is located at the increasing slope, and a second mirror, which is located at the decreasing slope, deflect impinging projection light so that it at least partly overlaps in the pupil plane. This ensures that the angular irradiance distribution at mask level is substantially independent from beam pointing fluctuations.

20 Claims, 7 Drawing Sheets

(51) Int. Cl.
*G02B 26/08* (2006.01)
*G03F 7/20* (2006.01)

(56) References Cited

U.S. PATENT DOCUMENTS

| | | | |
|---|---|---|---|
| 2008/0239268 A1* | 10/2008 | Mulder et al. | 355/67 |
| 2009/0115990 A1 | 5/2009 | Owa et al. | |
| 2011/0069305 A1* | 3/2011 | Tanitsu et al. | 356/237.2 |
| 2011/0304835 A1* | 12/2011 | Katzir et al. | 355/67 |
| 2014/0307245 A1* | 10/2014 | Tanaka et al. | 355/71 |

FOREIGN PATENT DOCUMENTS

| | | |
|---|---|---|
| EP | 2 282 188 A1 | 2/2011 |
| WO | WO 2005/026843 | 3/2005 |
| WO | WO 2009/080279 | 7/2009 |
| WO | WO 2012/034571 | 3/2012 |

OTHER PUBLICATIONS

International Preliminary Report on Patentability for corresponding PCT Appl No. PCT/EP2012/004212, dated Apr. 8, 2015.

* cited by examiner

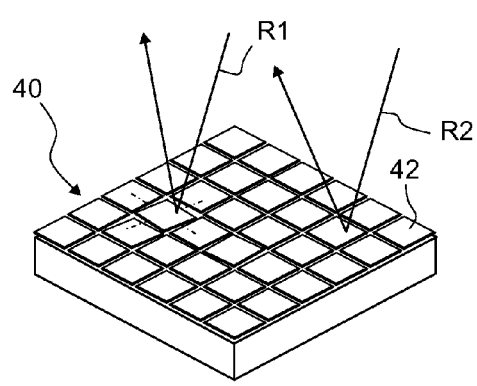
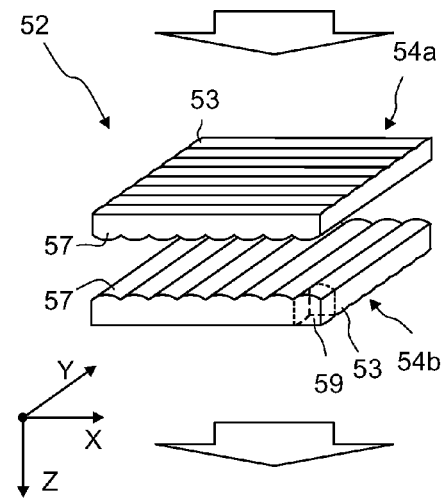
Fig. 3          Fig. 4
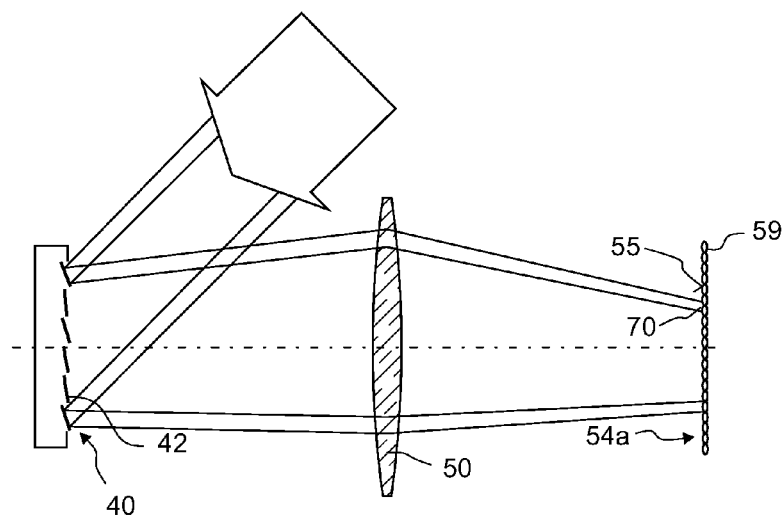
Fig. 5

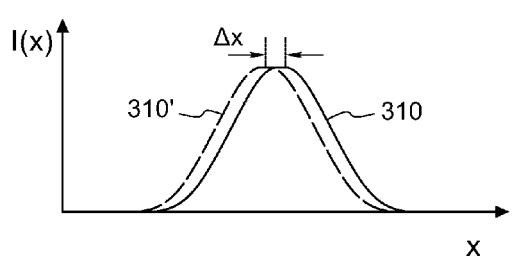
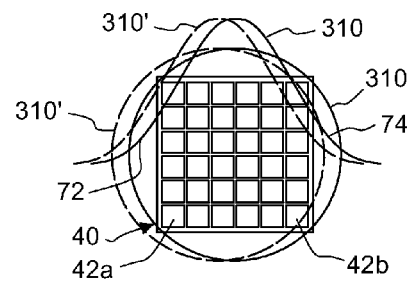
Fig. 6  Fig. 7
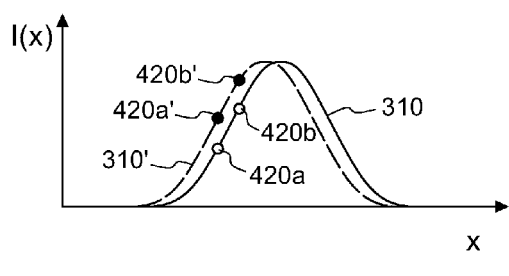
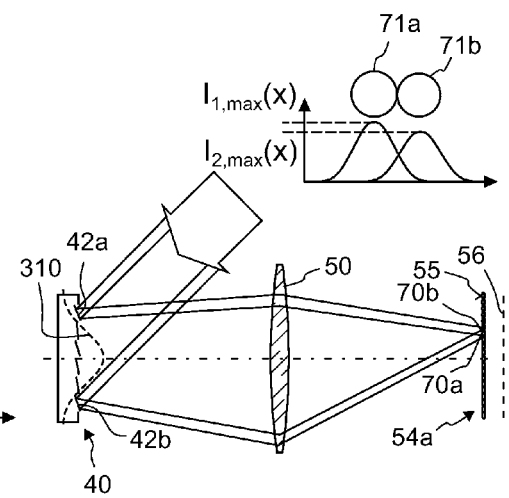
Fig. 8  Fig. 9
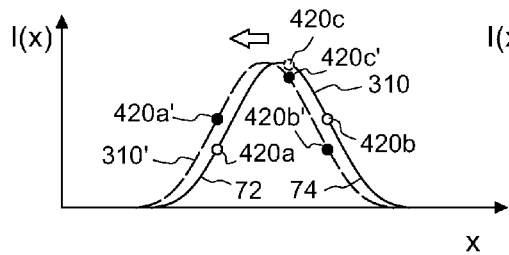
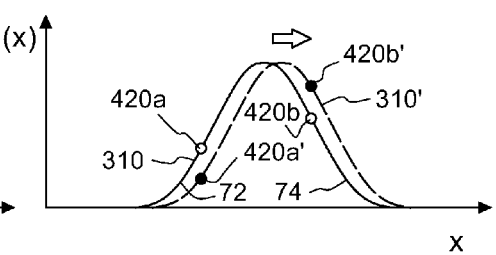
Fig. 10a  Fig. 10b

ILLUMINATION SYSTEM OF A MICROLITHOGRAPHIC PROJECTION EXPOSURE APPARATUS

CROSS-REFERENCE TO RELATED APPLICATION

The present application is a continuation of, and claims benefit under 35 USC 120 to, international application PCT/EP2012/004212, filed Oct. 8, 2012, the entire contents of which are incorporated by reference herein.

BACKGROUND OF THE INVENTION

1. Field of the Invention

The invention generally relates to an illumination system of a microlithographic projection exposure apparatus, and in particular to such an illumination system comprising an array of micromirrors or other light deflecting elements that can be individually controlled for variably illuminating a pupil plane of the illumination system.

2. Description of Related Art

Microlithography (also referred to as photolithography or simply lithography) is a technology for the fabrication of integrated circuits, liquid crystal displays and other microstructured devices. The process of microlithography, in conjunction with the process of etching, is used to pattern features in thin film stacks that have been formed on a substrate, for example a silicon wafer. At each layer of the fabrication, the wafer is first coated with a photoresist which is a material that is sensitive to light of a certain wavelength. Next, the wafer with the photoresist on top is exposed to projection light through a mask in a projection exposure apparatus. The mask contains a circuit pattern to be imaged onto the photoresist. After exposure the photoresist is developed to produce an image that corresponds to the circuit pattern contained in the mask. Then an etch process transfers the circuit pattern into the thin film stacks on the wafer. Finally, the photoresist is removed. Repetition of this process with different masks results in a multi-layered microstructured component.

A projection exposure apparatus typically includes an illumination system that illuminates a field on the mask that may have the shape of a rectangular or curved slit, for example. The apparatus further comprises a mask stage for aligning the mask, a projection objective (sometimes also referred to as 'the lens') that images the illuminated field on the mask onto the photoresist, and a wafer alignment stage for aligning the wafer coated with the photoresist.

One of the essential aims in the development of projection exposure apparatus is to be able to lithographically define structures with smaller and smaller dimensions on the wafer. Small structures lead to a high integration density, which generally has a favorable effect on the performance of the microstructured components produced with the aid of such apparatus. Furthermore, with high integration densities more components can be produced on a single wafer, which has a positive effect on the throughput of the apparatus.

Various approaches have been pursued in the past to achieve this aim. One approach is to improve the illumination of the mask. Ideally, the illumination system of a projection exposure apparatus illuminates each point of the field illuminated on the mask with projection light having a well defined total energy and angular irradiance distribution. The term angular irradiance distribution describes how the total light energy of a light bundle, which converges towards a particular point on the mask, is distributed among the various directions of the rays that constitute the light bundle.

The angular irradiance distribution of the projection light impinging on the mask is usually adapted to the kind of pattern to be imaged onto the photoresist. For example, relatively large sized features may require a different angular irradiance distribution than small sized features. The most commonly used angular irradiance distributions are referred to as conventional, annular, dipole and quadrupole illumination settings. These terms refer to the irradiance distribution in a pupil plane of the illumination system. With an annular illumination setting, for example, only an annular region is illuminated in the pupil plane. Thus there is only a small range of angles present in the angular irradiance distribution of the projection light, and all light rays impinge obliquely with similar angles onto the mask.

Different approaches are known in the art to modify the angular irradiance distribution of the projection light in the mask plane so as to achieve the desired illumination setting. For achieving maximum flexibility in producing different angular irradiance distribution in the mask plane, it has been proposed to use a spatial light modulator comprising a mirror array that produces the desired irradiance distribution in the pupil plane.

In EP 1 262 836 A1 the mirror array is realized as a microelectromechanical system (MEMS) comprising more than 1000 microscopic mirrors. Each mirror can be tilted about two orthogonal tilt axes so that incident projection light is reflected along a direction which is determined by the tilt angles of the respective mirror. A condenser lens arranged between the mirror array and a pupil plane translates the reflection angles produced by the mirrors into locations in the pupil plane. There, or on an optical integrator which is arranged in or in close vicinity to the pupil plane, each mirror produces a light spot whose position can be varied by tilting the mirror. Each light spot is freely movable across the pupil plane or a light entrance surface of the optical integrator by tilting the respective mirror.

Similar illumination systems using mirror arrays as spatial light modulators are known from US 2006/0087634 A1, U.S. Pat. No. 7,061,582 B2 and WO 2005/026843 A2.

In excimer lasers, which are usually used as light sources in the illumination system of VUV projection exposure apparatus, beam pointing fluctuations occur. This means that the direction of the light beam emitted from the laser varies to some extent in the long and/or short term. Since the light source is often arranged several meters away from the mirror array, even minute changes of the light beam direction result in significant displacements of the irradiance distribution which is produced by the projection light on the mirror array. This may ultimately lead to changes of the angular irradiance distribution in the mask plane that cannot be tolerated.

WO 2009/080279 A1 proposes to arrange an optical integrator comprising a plurality of microlenses between the light source and the mirror array. Adverse effects of beam pointing fluctuations on the stability of the angular irradiance distribution at mask level are thus avoided. However, the provision of an optical integrator significantly contributes to the costs of the illumination system and increases its complexity.

SUMMARY OF THE INVENTION

It is an object of the present invention to provide an illumination system of a microlithographic projection exposure apparatus which is capable of producing a stable angular distribution of the projection light at mask level even without an optical integrator that is arranged in front of the mirror array.

In accordance with the present invention, this object is achieved by an illumination system of a microlithographic projection exposure apparatus that comprises a light source being configured to produce a projection light beam, a pupil plane, a control unit and a spatial light modulator. The latter is arranged between the light source and the pupil plane and comprises an array of light deflecting elements. Each such element is capable of individually deflecting impinging projection light in a direction which depends on a command signal received from the control unit. The projection light produces an irradiance distribution on the array of light deflecting elements. The irradiance distribution or its envelope has, along at least one direction, an increasing slope and a decreasing slope. In accordance with the present invention the control unit is configured to control the light deflecting elements in such a way that a first light deflecting element, which is located at the increasing slope, and a second light deflecting element, which is located at the decreasing slope, deflect impinging projection light so that it at least partly overlaps in the pupil plane.

The invention is based on the perception that with such a control scheme displacements of the irradiance distribution, which is produced by the projection light beam on the array of light deflecting elements, will not significantly affect the total irradiance at the position in the pupil plane where the projection light deflected from the first and second light deflecting elements at least partly overlaps. This is because an increase of the irradiance on the first light deflecting element as a result of a displacement of the irradiance distribution is always accompanied by a similar or even identical decrease of the irradiance on the second light deflecting element. Due to this partial or even complete mutual compensation the total irradiance is at least substantially constant at a pupil position where the projection light deflected from the first and second light deflecting elements at least partly overlaps.

If this control scheme is applied to all or at least to a significant portion, for example more than 80%, of the light deflecting elements, displacements of the irradiance distribution along the at least one direction as a result of beam pointing fluctuations cannot significantly compromise the stability of the angular light distribution at mask level: at least the residual fluctuations of the angular light distribution at mask level can be made so small that they can be tolerated.

As a matter of course, the light deflecting elements may also be controlled in such a way that not only two, but three or more light deflecting elements illuminate the same spot in the pupil plane. For example, there may be N=1, 2, 3, . . . , first light deflecting elements, which are located at the increasing slope, and M=1, 2, 3, 4, . . . second light deflecting elements, which are located at the decreasing slope. Then all light deflecting elements deflect impinging projection light so that it at least partly overlaps in the pupil plane. If there are three or more light deflecting elements that contribute to the irradiance at a single pupil plane position, the absolute values of the steepness of the slopes, where the light deflecting elements are located, may differ to a larger extent.

In particular, if N first light deflecting elements $D_i$, with i=1, 2, 3, 4, . . . , N located at the increasing slope (72), and M second light deflecting elements $D_j$, j=1, 2, 3, 4, . . . , M located at the decreasing slope deflect impinging projection light so that it at least partly overlaps at a spot in the pupil plane, the inequation $$(S_1+S_2)<0.1\cdot(|S_1|+|S_2|)$$

may hold. Here $S_1=(I_1\cdot d_1)+(I_2\cdot d_2)+(I_3\cdot d_3)+ \ldots +(I_N\cdot d_N)$, wherein $I_i$ is the irradiance on the first beam deflecting element $D_i$ and $d_i$ is the directional derivative of the irradiance distribution along the at least one direction at the location of the first beam deflecting element $D_i$, and $S_2=(I_1\cdot d_1)+(I_2\cdot d_2)+(I_3\cdot d_3)+ \ldots +(I_M\cdot d_M)$, wherein $I_j$ is the irradiance on the second beam deflecting element $D_j$ and $d_j$ is the directional derivative of the irradiance distribution along the at least one direction at the location of the second beam deflecting element $D_j$.

Illustratively speaking, the sum of the directional derivatives weighed by the irradiances and taken over all light deflecting elements should be small compared to the directional derivative of a single spot. Ideally, the sum is zero.

If the irradiance distribution shifts not only along one direction, but along two orthogonal directions, it may be necessary to form groups of at least four light deflecting elements in which four pairs of light deflecting elements are controlled in the manner described above. As a matter of course, this again implies that all four light deflecting elements direct the projection light to the same position in the pupil plane.

When manufacturing the illumination system it is often not known how far away the light source will eventually be arranged from the mirror array after the entire apparatus has been installed in a semiconductor plant. Consequently beam pointing fluctuations may become an issue or not. In order to be able to produce a stable angular light distribution at mask level irrespective of the distance between the light source and the array, the control scheme as described above may be implemented in the illumination system at any rate, i.e. even if during the later operation of the illumination system the irradiance distribution on the array of light deflecting elements shifts only by insignificant distances along the at least one direction. The provision of the control scheme as a kind of safety measure is possible because the control scheme is not associated with any substantial disadvantages, and therefore it may be applied even if its benefits are not required in a specific installation of the projection exposure apparatus. In one embodiment the illumination system comprises a first reflecting surface, which is arranged so as to direct the projection light towards the array of light deflecting elements. A second reflecting surface is arranged to direct projection light deflected by the array of light deflecting elements towards the pupil plane. The first and second reflective surface may be planar, and in particular may be formed by surfaces of a prism. Then the prism (or the arrangement of reflecting surfaces) and the mirror array may simply replace, without a need to completely redesign the illumination system, an exchangeable diffractive optical element that is used in a conventional illumination system to produce different irradiance distributions in the pupil plane.

In another embodiment the illumination system comprises a zoom optical system which is arranged between the spatial light modulator and the pupil plane. This makes it possible to change the dimensions of the irradiance distribution without changing the deflection angles produced by the light deflecting elements.

In some embodiments the projection light associated with the first and second light deflecting element overlaps in the pupil plane to such an extent that a first line, on which an irradiance produced in the pupil plane by the first light deflecting element has dropped to 50% of a first maximum irradiance, and a second line, on which an irradiance produced in the pupil plane by the second light deflecting element has dropped to 50% of a second maximum irradiance, abut or overlap.

The light deflecting elements may, for example, be realized as micromirrors that can be tilted around at least one tilt axis, or as transparent elements that use the electro- or acousto-optical effect to deflect impinging light into various directions.

Subject of the invention is also a method of operating an illumination system of a microlithographic projection exposure apparatus. This method comprises the following steps:
a) providing a spatial light modulator that comprises an array of light deflecting elements, wherein a light spot in a pupil plane is associated with each light deflecting element;
b) producing an irradiance distribution on the array of light deflecting elements, wherein the irradiance distribution or its envelope has, along at least one direction, an increasing slope and a decreasing slope,
c) controlling the light deflecting elements in such a way that a first light spot, which is produced by a first light deflecting element located at the increasing slope, and a second light spot, which is produced by a second light deflecting element located at the decreasing slope, at least partly overlap in the pupil plane.

The above remarks made in connection with the illumination system in accordance with the present invention apply here as well.

DEFINITIONS

The term "light" denotes any electromagnetic radiation, in particular visible light, UV, DUV and VUV light.

The term "light ray" is used herein to denote light whose path of propagation can be described by a line.

The term "light bundle" is used herein to denote a plurality of light rays that emerge from and/or converge to a single point.

The term "light beam" is used herein to denote all light that passes through a particular lens or another optical element.

The term "surface" is used herein to denote any planar or curved surface in the three-dimensional space. The surface may be part of a body or may be completely separated therefrom, as it is usually the case with a field or a pupil plane.

The term "optically conjugate" is used herein to denote an imaging relationship between two points or two surfaces. Thus a light bundle emerging from a point converges at an optically conjugate point.

The term "field plane" is used herein to denote a plane that is optically conjugate to the mask plane.

The term "pupil plane" is used herein to denote a plane in which marginal rays passing through different points in the mask plane or another field plane intersect. As usual in the art, the term "pupil plane" is also used if it is in fact not a plane in the mathematical sense, but is slightly curved so that, in a strict sense, it should be referred to as pupil surface.

The term "condenser" is used herein to denote an optical element or an optical system that establishes (at least approximately) a Fourier relationship between two planes, for example a field plane and a pupil plane.

The term "uniform" is used herein to denote a property that does not depend on the position.

The term "spatial irradiance distribution" is used herein to denote how the total irradiance varies over a surface on which light impinges. Usually the spatial irradiance distribution can be described by a function $I_s(x, y)$, with x, y being spatial coordinates of a point in the surface.

The term "angular irradiance distribution" is used herein to denote how the irradiance of a light bundle varies depending on the angles of the light rays that constitute the light bundle. Usually the angular irradiance distribution can be described by a function $I_a(\alpha, \beta)$, with $\alpha,\beta$ being angular coordinates describing the directions of the light rays. If the angular irradiance distribution has a field dependency, $I_a$ will be also a function of field coordinates x,y, i.e. $I_a=I_a(\alpha,\beta,x,y)$.

The term "optical integrator" is used herein to denote an optical system that increases the product NA·a, wherein NA is the numerical aperture and a is the illuminated field area.

The term "optical raster element" is used herein to denote any optical element, for example a lens, a prism or a diffractive optical element, which is arranged, together with other identical or similar optical raster elements, on a common support so that they commonly form an optical raster plate.

BRIEF DESCRIPTION OF THE DRAWINGS

Various features and advantages of the present invention may be more readily understood with reference to the following detailed description taken in conjunction with the accompanying drawings in which:

FIG. 3 is a perspective view of a micromirror array contained in the illumination system shown in FIG. 2;

FIG. 4 is a perspective view of an optical integrator that is contained in the illumination system shown in FIG. 2;

FIG. 5 is a schematic meridional section through the micromirror array, the first condenser and the first optical raster plate of the illumination system shown in FIG. 2;

FIG. 6 is a graph showing the irradiance distribution along the X direction that is produced by projection light on the micromirror array shown in FIGS. 2 and 3;

FIG. 7 is a top view on the micromirror array in which the irradiance distribution shown in FIG. 6 is also indicated;

FIG. 8 is a graph similar to FIG. 6 which illustrates how the irradiances on two arbitrary micromirrors generally changes if the irradiance distribution on the micromirror array is displaced along the X direction;

FIG. 9 is a schematic meridional section similar to FIG. 5 that illustrates how spots produced by two micromirrors arranged at opposite sides of the irradiance distribution overlap;

FIGS. 10a and 10b are graphs similar to FIG. 8 which illustrate how displacements of the irradiance distribution on the micromirror array along the +X and the −X direction, respectively, affect the irradiances on the two micromirrors in accordance with the present invention;

DESCRIPTION OF PREFERRED EMBODIMENTS

I

General Construction of Projection Exposure Apparatus

Figure 1:
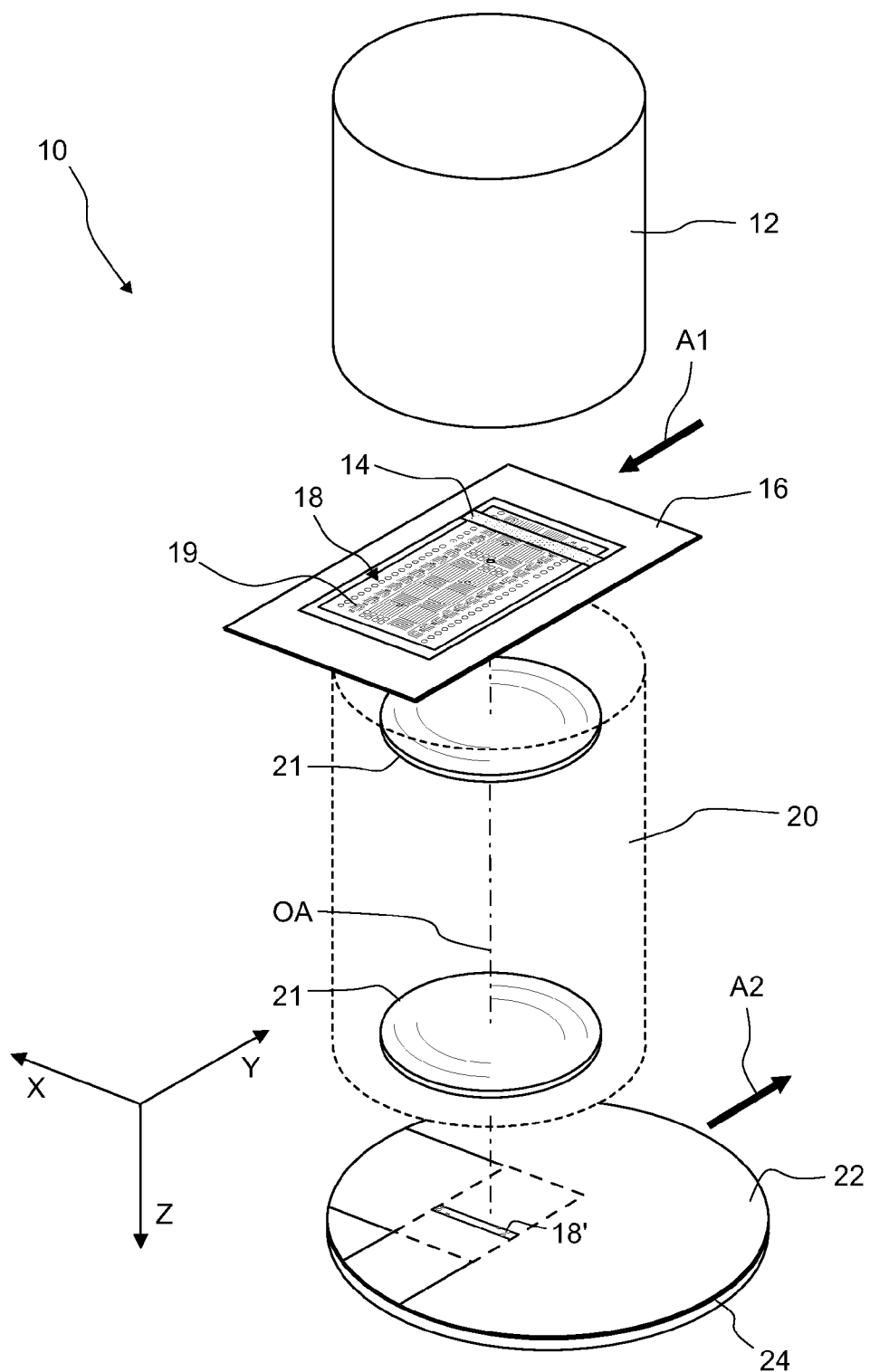
FIG. 1 is a schematic perspective view of a projection exposure apparatus in accordance with one embodiment of the present invention.

FIG. 1 is a perspective and highly simplified view of a projection exposure apparatus 10 in accordance with the present invention. The apparatus 10 comprises an illumination system 12 which produces a projection light beam. The latter illuminates a field 14 on a mask 16 containing a pattern 18 of fine features 19. In this embodiment the illuminated field 14 has a rectangular shape. However, other shapes of the illuminated field 14, for example ring segments, are contemplated as well.

A projection objective 20 having an optical axis OA and containing a plurality of lenses 21 images the pattern 18 within the illuminated field 14 onto a light sensitive layer 22, for example a photoresist, which is supported by a substrate 24. The substrate 24, which may be formed by a silicon wafer, is arranged on a wafer stage (not shown) such that a top surface of the light sensitive layer 22 is precisely located in an image plane of the projection objective 20. The mask 16 is positioned via a mask stage (not shown) in an object plane of the projection objective 20. Since the latter has a magnification $\beta$ with $|\beta|<1$, a minified image 18' of the pattern 18 within the illuminated field 14 is projected onto the light sensitive layer 22.

During the projection the mask 16 and the substrate 24 move along a scan direction which corresponds to the Y direction indicated in FIG. 1. The illuminated field 14 then scans over the mask 16 so that patterned areas larger than the illuminated field 14 can be continuously imaged. The ratio between the velocities of the substrate 24 and the mask 16 is equal to the magnification $\beta$ of the projection objective 20. If the projection objective 20 inverts the image ($\beta<0$), the mask 16 and the substrate 24 move in opposite directions, as this is indicated in FIG. 1 by arrows A1 and A2. However, the present invention may also be used in stepper tools in which the mask 16 and the substrate 24 do not move during the projection of the mask.

II

General Construction of Illumination System

Figure 2:
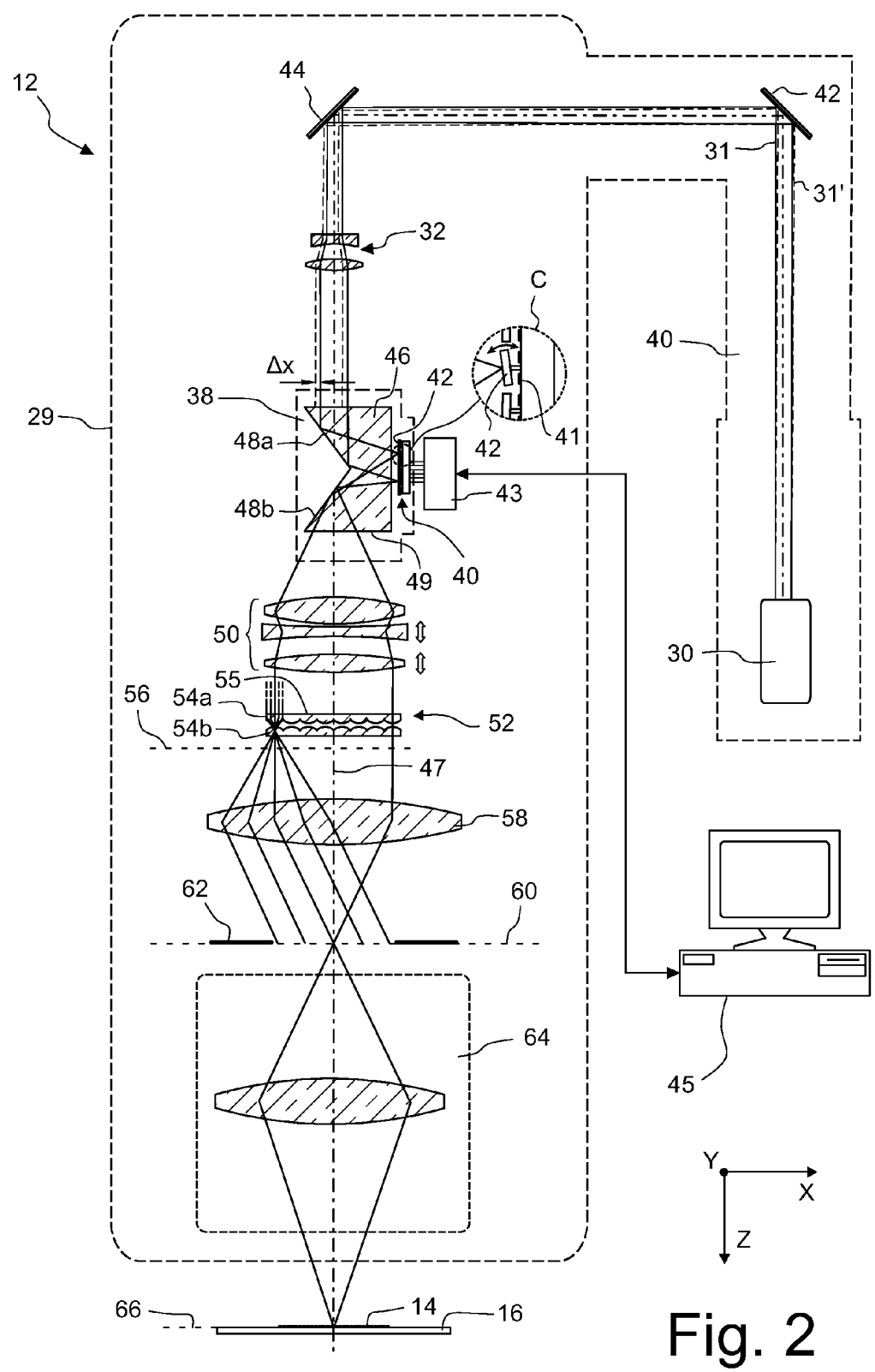
FIG. 2 is a meridional section through an illumination system which is contained in the apparatus shown in FIG. 1.

FIG. 2 is a meridional section through the illumination system 12 shown in FIG. 1. For the sake of clarity the illustration of FIG. 2 is considerably simplified and not to scale. This particularly implies that different optical units are represented by one or very few optical elements only. In reality, these units may comprise significantly more lenses and other optical elements.

The illumination system 12 includes a housing 29 and a light source 30 that is, in the embodiment shown, realized as an excimer laser. The light source 30 emits a beam 31 of projection light having a wavelength of about 193 nm. Other types of light sources 30 and other wavelengths, for example 248 nm or 157 nm, are also contemplated.

The projection light beam 31 emitted from the light source 30 passes through a channel which is usually referred to as beam delivery 40. Within the beam delivery 40 a first planar beam path folding mirror 42 is arranged in this embodiment. The total length of the beam delivery 40 is typically in a range between 2 m and 25 m. The dimensions and the shape of the beam delivery 40 and also the number of beam path folding mirrors contained therein depend on the local conditions prevailing where the projection exposure apparatus 10 is to be installed.

After leaving the beam delivery 40, the projection light beam 31 is deviated by a second beam path folding mirror 44 and enters a beam expansion unit indicated at 32 in which the projection light beam 31 is expanded. To this end the beam expansion unit 32 may comprise several lenses, for example a negative and a positive lens as shown in FIG. 2, and/or several planar mirrors. After the expansion the light beam 31 has still a low divergence, i.e. it is almost collimated.

The expanded light beam 31 impinges on a spatial light modulator 38 that is used to produce variable spatial irradiance distributions in a subsequent pupil plane. In this embodiment the spatial light modulator 38 comprises an array 40 of micromirrors 42 that can be individually tilted about two orthogonal axes with the help of actuators comprising electrodes 41 (see enlarged cutout C). The spatial light modulator 38, and in particular the actuators 41 for the micromirrors 42, are controlled by a control unit 43 which is connected to an overall system control 45.

FIG. 3 is a perspective view of the array 40 illustrating how light rays R1, R2 are reflected into different directions depending on the tilting angles of the micromirrors 42 on which the light rays R1, R2 impinge. In FIGS. 2 and 3 the array 40 comprises only 66 micromirrors 42; in reality the array 40 may comprise several hundreds or even several thousands micromirrors 42.

Referring again to FIG. 2, the spatial light modulator 38 further comprises a prism 46 having a first planar surface 48a and a second planar surface 48b that are both inclined with respect to an optical axis 47 of the illumination system 12. At these inclined surfaces 48a, 48b the projection light beam 31 is reflected by total internal reflection. The first surface 48a reflects the impinging projection light beam 31 towards the micromirrors 42 of the array 40, and the second surface 48b directs the light beams reflected from the micromirrors 42 towards a planar exit surface 49 of the prism 46. As a matter of course, the prism 46 may be replaced by an arrangement of planar mirrors.

The directions of the reflected light beams, and thus the angular irradiance distribution of the projection light emerging from the exit surface 49 of the prism 46, can thus be varied by individually tilting the micromirrors 42 of the array 40 around their tilt axes. More details with regard to the spatial light modulator 38 can be gleaned from US 2009/0115990 A1, for example.

The angular irradiance distribution produced by the spatial light modulator 38 is transformed into a spatial irradiance distribution with the help of a first condenser 50 which directs the impinging projection light towards an optical integrator 52. In this embodiment the first condenser 50 is formed by a zoom optical system having a variable focal length. To this end the first condenser may comprise a plurality of lenses from which two or more can be displaced along the optical axis 47 with the help of actuators (not shown). The diameter of the irradiance distribution produced by the spatial light modulator 38 can thus be varied by changing the focal length of the first condenser 50.

The optical integrator 52 comprises, in the embodiment shown, a first optical raster plate 54a and a second optical raster plate 54b. A light entrance surface 55 of the first optical raster plate 54a is arranged in a back focal plane of the first condenser 50, and the micromirrors 42 are arranged approximately in its front focal plane so that a Fourier relationship is established between the micromirrors 42 on the one hand and the light entrance surface 55 of the first optical raster plate 54a on the other hand.

As can be seen in the perspective view of the optical integrator 52 shown in FIG. 4, each optical raster plate 54a, 54b includes two orthogonal arrays of first and second cylindrical microlenses 53, 57 that are arranged on opposite sides of the optical raster plates 54a, 54b. The second cylindrical microlenses 57 extending along the Y axis are more strongly curved than the first cylindrical microlenses 53 extending along the X direction. A volume that is confined by two intersecting orthogonal cylindrical microlenses 53, 57 defines an optical raster element 59 having a refractive power along the X and the Y direction. However, due to the different curvatures of the first and second cylindrical microlenses 53, 57, the optical raster elements 59 have a stronger refractive power along the X direction than along the Y direction.

Referring again to FIG. 2, the optical integrator 52 produces a plurality of secondary light sources in a subsequent pupil plane 56 of the illumination system 12. A second condenser 58 establishes a Fourier relationship between the pupil plane 56 and a field stop plane 60 in which an adjustable field stop 62 is arranged. The second condenser 58 thus superimposes the light beams emerging from the secondary light sources in the field stop plane 60 so that the latter is illuminated very homogenously.

The field stop plane 60 is imaged by a field stop objective 64 onto a mask plane 66 in which the mask 16 supported on a mask stage (not shown) is arranged. Also the adjustable field stop 62 is thereby imaged on the mask plane 66 and defines at least the lateral sides of the illuminated field 14 extending along the scan direction Y.

The spatial irradiance distribution on the light entrance surface 55 of the first optical raster plate 54a determines the spatial irradiance distribution in the pupil plane 56 and thus the angular irradiance distribution in the field stop plane 60 and the mask plane 66. As can be seen in the schematic and simplified meridional section of FIG. 5, the spatial irradiance distribution on the light entrance surface 55 is, in turn, determined by the tilting angles of the micromirrors 42. Each micromirror 42 illuminated by projection light produces a single light spot 70 on the light entrance surface 55 of the first optical raster plate 54a. The position of this light spot 70 can be freely varied by tilting the associated micromirror 42. By carefully setting the tilting angles of the micromirrors 42 with the help of the actuators 41 that are controlled of the control unit 43, it is thus possible to quickly produce almost any arbitrary angular irradiance distribution in the mask plane 66. This makes it possible to quickly adapt the angular irradiance distribution in the mask plane 66 to the pattern 18 contained in the mask 16. By using an angular irradiance distribution which is specifically tailored to the pattern 18, the latter can be imaged more accurately onto the light sensitive layer 22.

III

Laser Beam Pointing Fluctuations

The direction of the projection light beam 31 emitted by the light source 30 is usually subject to beam pointing fluctuations. This means that the direction of the projection light beam 31 is not perfectly stable in time, but varies to some extent.

The origin of beam pointing fluctuations may be mechanical vibrations, for example vibrations that have been picked up from the ground or which result from the rapid exchange of gas in excimer lasers. Such beam pointing fluctuations often have a frequency between some 10 Hz up to some 10 kHz. Another cause for beam pointing fluctuations are drift effects which are often induced by thermal effects. Drift effects often occur in the long term, and thus the beam pointing fluctuations may become apparent only over longer time periods, for example some minutes, days or even months.

In those excimer lasers that are typically used as light source 30, the maximum angular fluctuations have been successively reduced to values well below 0.1 mrad. In spite of these minute values, however, the displacement of the irradiance distribution, which is produced by the projection light on the array 40 of micromirrors 42, may be significant due to the sometimes very long distances between the light source 30 and the array 40.

This is illustrated in FIG. 2 for a projection light beam 31' having a propagation direction which slightly deviates from the direction of the undisturbed projection light beam 31. After passing through the long beam delivery 40, the slightly tilted projection light beam 31' impinges on the spatial light modulator 38 with a displacement $\Delta x$ along the X direction.

FIG. 6 is a graph showing in solid lines the irradiance distribution 310 across a diameter of the projection light beam 31 along the X direction at the entrance side of the spatial light modulator 38. The irradiance distribution 310 has approximately a Gaussian shape, although it may have in reality a flatter central section than shown. With a broken line the irradiance distribution 310' for the projection light beam 31' is shown that has been produced by the light source 30 as a result of beam pointing fluctuations. The maximum displacement along the X direction is indicated again by $\Delta x$.

FIG. 7 is a top view on the array 40 of micromirrors 42 which illustrates how beam pointing fluctuations affect the illumination of the micromirrors 42. The irradiance distribution 310 on the array 40 produced by the undisturbed projection light beam 31 is represented by a circular solid line indicating positions where the maximum intensity occurring at the center of the projection light beam 31 has dropped to 10%, and also by a Gaussian curve as shown in FIG. 6. If light losses shall be reduced, it is of course possible to deviate from the square arrangement of micromirrors 42 and to adapt the arrangement of micromirrors 42 better to the substantially circular cross-section of the projection light beam 31. The exact intensity profile is obtained by convoluting the shape of the exit aperture of the excimer laser used as light source 30 and its divergence. Therefore, as an alternative, the exit aperture of the excimer laser used as light source 30 may be modified so that the cross section of the projection light beam 31 approximates a square, as this is the case in the embodiment shown below in FIG. 14.

With broken lines a displaced irradiance distribution 310' is indicated that is produced by the slightly tilted projection light beam 31'. It can be seen that the irradiance on each individual micromirror 42 changes if the irradiance distribution is displaced in the short or the long term as a result of beam pointing fluctuations. Since a single light spot 70 is produced by each micromirror 42 on the light entrance surface 55 of the first optical raster plate 54a, and thus also in the subsequent pupil plane 56 of the illumination system 12, beam pointing fluctuations thus change the irradiances of the spots produced in the pupil plane. However, the irradiance distribution in the pupil plane 56, which is a superposition of all spots 70 produced by the micromirrors 42, has to be kept constant so as to prevent that the structures 19 on the mask 14 are imaged with varying quality on the light sensitive layer 22.

FIG. 8 illustrates how beam pointing fluctuations generally modify the irradiances on two different micromirrors which are spaced apart by a distance along the X direction. For the sake of simplicity it is again assumed that the irradiance distribution 310' is displaced only along the X direction. The irradiance distribution may be displaced, as a matter of course, also or exclusively along the Y direction.

As a result of the Gaussian irradiance distribution 310 of the projection light beam 31 shown in FIG. 6, irradiances 420a, 420b on two micromirrors 42 having different x coordinates are generally different, as it can be seen in FIG. 8.

For the displaced irradiance distribution 310' produced by the tilted projection light beam 31', the irradiances 420a', 420b' on the same micromirrors 42 are significantly higher than before. Consequently, also the light spots 70 produces by these micromirrors 42 will be brighter so that the irradiance distribution in the pupil plane 56 changes. This, in turn, leads to changes of the angular distribution of projection light at mask level, and thus the beam pointing fluctuations eventually result in fluctuations of the imaging quality.

IV

Micromirror Control

In the following it will be explained with reference to FIGS. 7, 9, 10a and 10b how such adverse effects can be avoided by a sophisticated control scheme applied by the control unit 43.

In this embodiment the micromirrors 42 are controlled by the control unit 43 in such a way that always pairs of light spots 70a, 70b completely or at least partly overlap in the pupil plane 56. Since the optical integrator 52 modifies only the divergence of light passing through it, this is equivalent to a light spot overlap on the preceding light entrance surface 55 of the first optical raster plate 54a, as this is shown in FIG. 2 and the simplified cutout of FIG. 9. Generally the overlap of the spots 70a, 70b may be so large that a first line 71a, on which an irradiance produced in the pupil plane 56 by the first light deflecting element 42a has dropped to 50% of a first maximum irradiance $I_{1,max}$, and a second line 71b, on which an irradiance produced in the pupil plane 56 by the second light deflecting element 42b has dropped to 50% of a second maximum irradiance $I_{2,max}$, abut or even overlap.

As can be seen in FIGS. 7 and 9, the micromirrors 42 producing the overlapping light spots 70a, 70b are selected such that a first light spot 70a is produced by a first micromirror 42a which is located at the increasing slope 72 of the irradiance distribution 310 which is produced by the projection light beam 31 on the array 40 of micromirrors 42. The second light spot 70b is produced by a micromirror 42b which is located on the decreasing slope 74 of the irradiance distribution 310.

The total irradiance in the pupil plane 56 (or at the preceding light entrance surface 55) at the position, where the two light spots 70a, 70b produced by the micromirrors 42a, 42b completely or at least partly overlap, is substantially (i.e. if light losses are disregarded) the sum of the irradiances on the two micromirrors 42a, 42b. Since a perfect overlap of the light spots 70a, 70b may be difficult to achieve and the irradiance within each light spot 70a, 70b is generally not uniform, the sum of the irradiances should be considered as an integral over the irradiances over the overlapping areas which are illuminated in the pupil plane 56 by the two light spots 70a, 70b.

The graph shown in FIG. 10a indicates by white circles the irradiances 420a, 420b on the two micromirrors 42a and 42b, respectively. If the irradiance distribution is displaced along the −X direction as a result of beam pointing fluctuations, as it is shown in FIG. 10a with a broken line 310', this will result in different irradiances 420a', 420b' on the micromirrors 42a, 42b, as it has been explained above with reference to FIG. 8. However, since the micromirrors 42a, 42b that contribute to the irradiance at the same position in the pupil plane 56 are located at opposite slopes 72, 74 of the irradiance distribution 310, a displacement of the latter along the −X direction has the result that the irradiance on the first micromirror 42a increases from 420a to 420a', whereas the irradiance on the second micromirror 42b decreases from 420b to 420b'. In other words, the increase of the irradiance 420a on the first micromirror 42a is partially or even completely compensated for by a decrease of the irradiance 420b on the second micromirror 42b. Thus displacements of the irradiance distribution 310 on the array 40 caused by beam pointing fluctuations have only very little or even no effect at all on the irradiance distribution on the light entrance surface 55 and thus in the subsequent pupil plane 56.

FIG. 10b illustrates the situation if the irradiance distribution 310' produced by the tilted projection light beam 31' is displaced along the +X direction with respect to the undisturbed irradiance distribution 310. It can be seen that again the sum of the irradiances on the micromirrors 42a, 42b is not significantly affected by such a displacement.

From FIGS. 10a and 10b it becomes clear that the mutual compensation of the changes of irradiances 420a, 420b on the micromirrors 42, 42b becomes better the more similar the steepnesses of the slopes 72, 74 are, in absolute terms, at the locations of the first and second micromirror 42a, 42b. For example, if a micromirror was selected as the second micromirror that is located closer to the center of the irradiance distribution 310, the irradiance denoted by a dotted circle 420c in FIG. 10a would decrease only to irradiance 420c'. This decrease is much less than the increase of the irradiance 420a to 420a' on the first micromirror 42a, and consequently the mutual compensation would be small, too. This may be "repaired" if there are more than one first and second micromirror that contribute to the irradiance at the same position in the pupil surface 56. For example, if the first micromirror 42a is located as before, and two second micromirrors, which also direct the projection light towards the same position in the pupil plane 56, are located close to the center of the irradiance distribution as it is indicated with irradiance 420c in FIG. 10a, an almost complete mutual compensation is possible.

V

Alternative Embodiments

Figure 11:
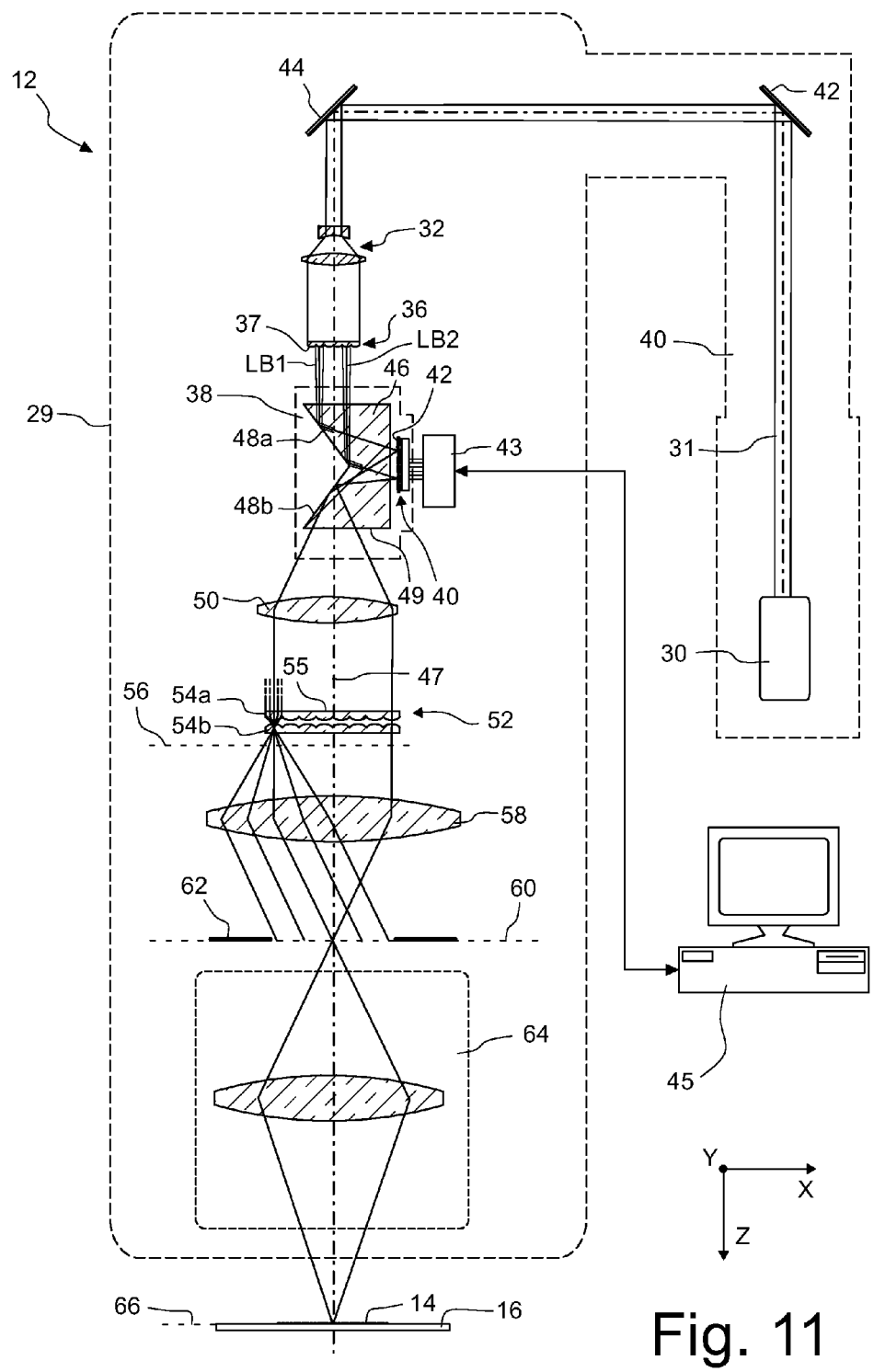
FIG. 11 is a meridional section through an illumination system similar to FIG. 2 according to an alternative embodiment, in which a microlens array is used to divide the projection light beam into a plurality of individual light beams that are directed onto the micromirror array.

FIG. 11 is a meridional section through an illumination system 12 according to an alternative embodiment. In this embodiment the first condenser 50 has a fixed focal length. Furthermore, a microlens array 36 comprising a plurality of microlenses 37 is arranged between the beam expansion unit 32 and the spatial light modulator 38.

Figures 12, 13:
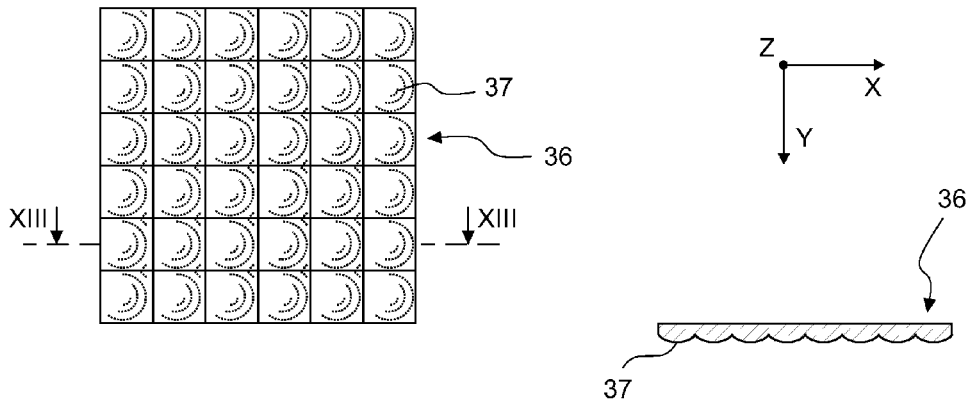
FIG. 12 is a top view on the microlens array of the illumination system shown in FIG. 11.
FIG. 13 shows a cross section along line XIII-XIII through the microlens array shown in FIG. 12.

FIG. 12 is a top view on the microlens array 36, and FIG. 13 shows a cross section through the microlens array 36 along line XIIII-XIII. Each microlens 37 has a square borderline. As can best be seen in the cross-section of FIG. 13, the microlenses 37 are planar-convex lenses having a positive refractive power. Thus the substantially parallel projection light 31 impinging on the microlens array 36 is divided into a plurality of individual converging light beams, from which only two denoted by LB1, LB2 are shown in FIG. 11. After entering the prism 46, each light beam LB1, LB2 impinges on one of the micromirrors 42 of the array 40. The focal length of the microlenses 37 is determined such that the diameter of the light beams LB1, LB2 at the micromirrors 42 is smaller than the maximum dimension of their mirror surface. Then no projection light is incident on gaps between adjacent micromirrors 42. This has not only the advantage of reducing light losses, but also prevents projection light from heating up electronic components that are arranged at the bottom of the gaps.

Figures 14, 15:
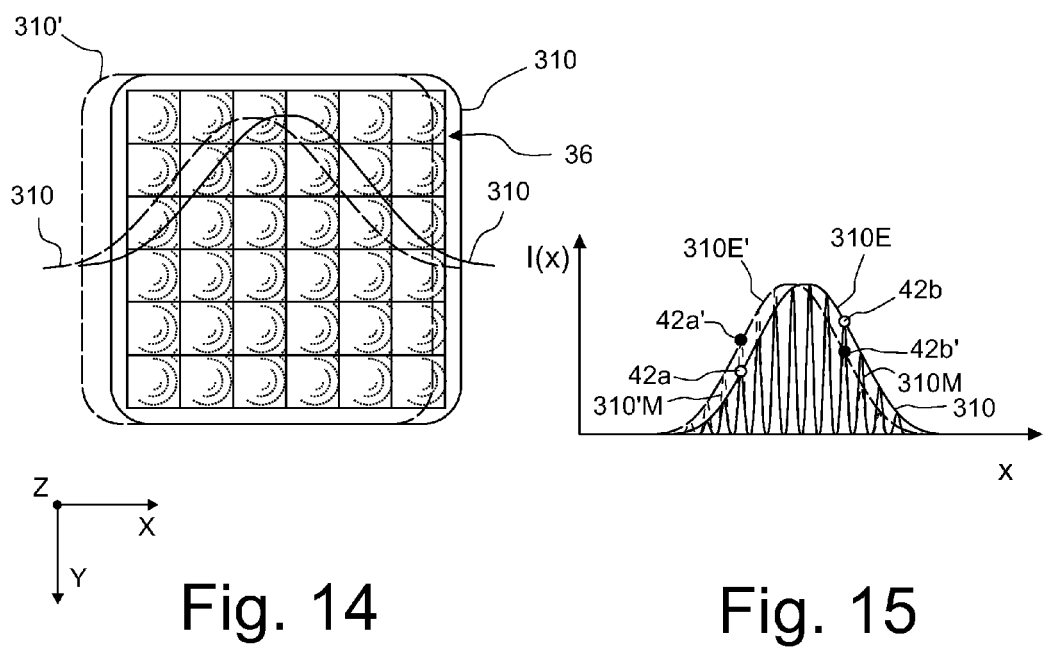
FIG. 14 is a top view similar to FIG. 12, but also showing the irradiance distribution on the rear side of the microlens array.
FIG. 15 is a graph similar to FIG. 10a which illustrates how a displacement of the irradiance distribution on the micromirror array along the +X direction affects the irradiances on the two micromirrors.

FIG. 14 shows, in a top view similar to FIG. 7, the microlens array 36 and the irradiance distribution 310 which is produced by the projection light beam 31 on its rear planar surface. Similar to FIG. 7, the irradiance distribution 310 is represented by a line indicating positions where the maximum intensity has dropped to 10%, and a curve indicating the Gaussian irradiance profile. With broken lines an irradiance distribution 310' is indicated which is displaced along the X direction as a result of beam pointing fluctuations.

FIG. 15 shows, in a graph similar to FIG. 10a, how such a displacement affects the irradiances on the first and second micromirrors 42a, 42b along the X direction. As a result of the focusing effect produced by the microlenses 37, the irradiance distribution 310M on the array 40 is obtained by a modulation of the irradiance distribution 310 on the rear side of the microlens array 36 with a periodic function having a spatial frequency which is equal to the pitch of the micromirrors 42. The envelope 310E of the irradiance distribution 310M on the array 40 is thus approximately proportional to the irradiance distribution 310 on the rear side of the microlens array 36 shown in FIG. 14. The same also applies to the displaced irradiance distribution 310M' and its envelope 310E' being a result of beam pointing fluctuations.

The micromirrors 42 are controlled by the control unit 43 in the same manner as it has been explained above with reference to FIGS. 7, 9, 10a and 10b. The only modification is that the two micromirrors 42a, 42b which contribute to the irradiance at the same position in the pupil plane are not located at the opposite sides of the modulated irradiance distribution 310M on the array 40, but on opposite sides of its envelope 310E.

VI

Important Method Steps

Figure 16:
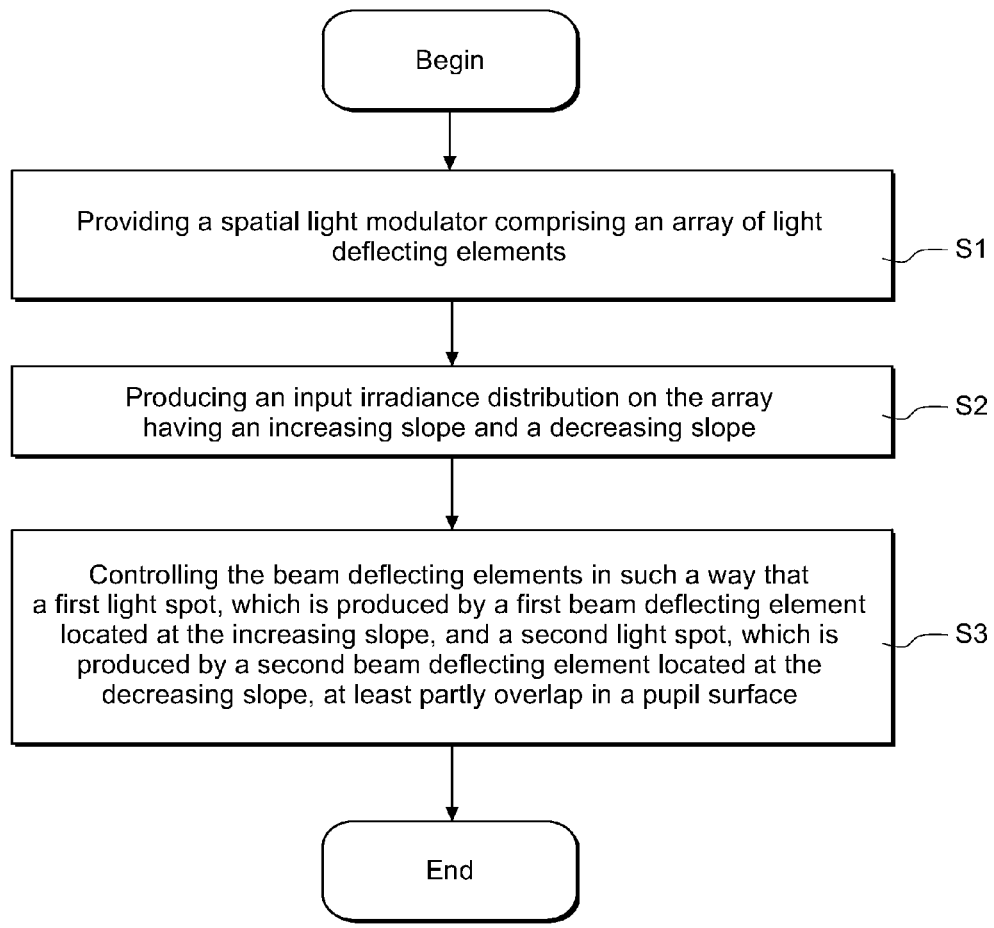
FIG. 16 is a flow diagram illustrating important method steps of the present invention.

FIG. 16 is a flow diagram which illustrates important steps of operating a microlithographic projection exposure apparatus in accordance with the present invention.

In a first step S1 a spatial light modulator comprising an array of light deflecting elements is provided.

In a second step S2 an irradiance distribution having an increasing slope and a decreasing slope is produced on the array.

In a third step S3 the light deflecting elements are controlled in such a way that a first light spot, which is produced by a first light deflecting element located at the increasing slope, and a second light spot, which is produced by a second light deflecting element located at the decreasing slope, at least partly overlap in a pupil plane.

The invention claimed is:

1. An illumination system having a pupil plane, the illumination system comprising:
a control unit; and
a spatial light modulator arranged upstream of the pupil plane along a path of projection light through the illumination system, the spatial light modulator comprising an array of light deflecting elements configured so that, during use of the illumination system, the light deflecting elements individually deflect impinging projection light in a direction based on a command signal received from the control unit,
wherein during use of the illumination system:
the projection light produces an irradiance distribution on the array of light deflecting elements;
the irradiance distribution or its envelope has, along a direction, an increasing slope and a decreasing slope;
a first light deflecting element of the array of light deflecting elements is located at the increasing slope;
a second light deflecting element of the array of light deflecting elements is located at the decreasing slope; and
the control unit controls the first and second light deflecting elements so that projection light deflected by the first and second deflecting elements at least partly overlaps in the pupil plane while taking into account the slopes of the irradiance distribution; and
wherein the illumination system is a microlithographic projection exposure illumination system.

2. The illumination system of claim 1, further comprising a light source configured to produce the projection light during use of the illumination system.

3. The illumination system of claim 1, wherein, during use of the illumination system, an emission direction of the projection light beam varies so that the irradiance distribution of the projection light on the array of light deflecting elements shifts along the direction.

4. The illumination system of claim 3, wherein:
N first light deflecting elements $D_i$, with i=1, 2, 3, 4, . . . , N are located at the increasing slope;
M second light deflecting elements $D_j$, j=2, 3, 4, . . . , M are located at the decreasing slope;
during use of the illumination system, the N first light deflecting elements and M second light deflecting elements deflect impinging projection light so that the projection light at least partly overlaps at a spot in the pupil plane;

$$(S_1+S_2)<0.1\cdot(|S_1|+|S_2|);$$

$$S_1=(I_1\cdot d_1)+(I_2\cdot d_2)+(I_3\cdot d_3)+\ldots+(I_N\cdot d_N);$$

$I_i$ is an irradiance of the projection light on the first beam deflecting element $D_i$;
$d_i$ is a directional derivative of the irradiance distribution of the projection light along the direction at the location of the first beam deflecting element $D_i$;

$$S_2=(I_1\cdot d_1)+(I_2\cdot d_2)+(I_3\cdot d_3)+\ldots+(I_M\cdot d_M);$$

$I_j$ is an irradiance of the projection light on the second beam deflecting element $D_j$; and
$d_j$ is a directional derivative of the irradiance distribution of the projection light along the direction at the location of the second beam deflecting element $D_j$.

5. The illumination system of claim 4, further comprising:
a first reflecting surface configured so that, during use of the illumination system, the first reflecting surface directs projection light toward the array of light deflecting elements; and
a second reflecting surface configured so that, during use of the illumination system, the second reflecting surface directs projection light deflected by the array of light deflecting elements toward the pupil plane.

6. The illumination system of claim 5, comprising a prism which includes the first and second reflecting surfaces.

7. The illumination system of claim 6, further comprising a zoom optical system between the spatial light modulator and the pupil plane along the path of the projection light through the illumination system.

8. An illumination system having a pupil plane, the illumination system comprising:
a control unit; and
a spatial light modulator arranged upstream of the pupil plane along a path of projection light through the illumination system, the spatial light modulator comprising an array of light deflecting elements configured so that, during use of the illumination system, the light deflecting elements individually deflect impinging projection light in a direction based on a command signal received from the control unit,
wherein during use of the illumination system:
the projection light produces an irradiance distribution on the array of light deflecting elements;
the irradiance distribution or its envelope has, along a direction, an increasing slope and a decreasing slope;
a first light deflecting element of the array of light deflecting elements is located at the increasing slope;
a second light deflecting element of the array of light deflecting elements is located at the decreasing slope; and
the control unit controls the first and second light deflecting elements so that projection light deflected by the first and second deflecting elements at least partly overlaps in the pupil plane;
wherein:
the illumination system is a microlithographic projection exposure illumination system;
N first light deflecting elements $D_i$, with i=1, 2, 3, 4, . . . , N are located at the increasing slope;
M second light deflecting elements $D_j$, j=2, 3, 4, . . . , M are located at the decreasing slope;
during use of the illumination system, the N first light deflecting elements and M second light deflecting elements deflect impinging projection light so that the projection light at least partly overlaps at a spot in the pupil plane;

$$(S_1+S_2)<0.1\cdot(|S_1|+|S_2|);$$

$$S_1=(I_1\cdot d_1)+(I_2\cdot d_2)+(I_3\cdot d_3)+\ldots+(I_N\cdot d_N);$$

$I_i$ is an irradiance of the projection light on the first beam deflecting element Di;
$d_i$ is a directional derivative of the irradiance distribution of the projection light along the direction at the location of the first beam deflecting element $D_i$;

$$S_2=(I_1\cdot d_1)+(I_2\cdot d_2)+(I_3\cdot d_3)+\ldots+(I_M\cdot d_M);$$

$I_j$ is an irradiance of the projection light on the second beam deflecting element $D_j$; and
$d_j$ is a directional derivative of the irradiance distribution of the projection light along the direction at the location of the second beam deflecting element $D_j$.

9. The illumination system of claim 8, further comprising:
a first reflecting surface configured so that, during use of the illumination system, the first reflecting surface directs projection light toward the array of light deflecting elements; and
a second reflecting surface configured so that, during use of the illumination system, the second reflecting surface directs projection light deflected by the array of light deflecting elements toward the pupil plane.

10. The illumination system of claim 9, comprising a prism which includes the first and second reflecting surfaces.

11. The illumination system of claim 10, further comprising a zoom optical system between the spatial light modulator and the pupil plane along the path of the projection light through the illumination system.

12. The illumination system of claim 1, further comprising:
a first reflecting surface configured so that, during use of the illumination system, the first reflecting surface directs projection light toward the array of light deflecting elements; and
a second reflecting surface configured so that, during use of the illumination system, the second reflecting surface directs projection light deflected by the array of light deflecting elements toward the pupil plane.

13. The illumination system of claim 12, comprising a prism which includes the first and second reflecting surfaces.

14. The illumination system of claim 13, further comprising a zoom optical system between the spatial light modulator and the pupil plane along the path of the projection light through the illumination system.

15. The illumination system of claim 1, further comprising a zoom optical system between the spatial light modulator and the pupil plane along the path of the projection light through the illumination system.

16. A method, comprising:
producing an irradiance distribution of projection light on an array of light deflecting elements of a spatial light modulator in an illumination system of a microlithographic projection exposure apparatus, the irradiance distribution or its envelope having, along a direction, an increasing slope and a decreasing slope; and
controlling the light deflecting elements of the array of light deflecting elements so that:
a first projection light spot, which is produced by a first light deflecting element of the array of light deflecting elements, is located at the increasing slope;
a second projection light spot, which is produced by a second light deflecting element of the array of light deflecting elements, is located at the decreasing slope; and the first and second projection light spots at least partly overlap in the pupil plane,
wherein:
N first light deflecting elements $D_i$, with i=1, 2, 3, 4, . . . , N are located at the increasing slope;
M second light deflecting elements $D_j$, j=2, 3, 4, . . . , M are located at the decreasing slope;
the N first light deflecting elements and M second light deflecting elements deflect impinging projection light so that the projection light at least partly overlaps at a spot in the pupil plane;

$$(S_1+S_2)<0.1\cdot(|S_1|+|S_2|);$$

$$S_1=(I_1\cdot d_1)+(I_2\cdot d_2)+(I_3\cdot d_3)+\ldots+(I_N\cdot d_N);$$

$I_i$ is an irradiance of the projection light on the first beam deflecting element Di;
$d_i$ is a directional derivative of the irradiance distribution of the projection light along the direction at the location of the first beam deflecting element $D_i$;

$$S_2=(I_1\cdot d_1)+(I_2\cdot d_2)+(I_3\cdot d_3)+\ldots+(I_M\cdot d_M);$$

$I_j$ is an irradiance of the projection light on the second beam deflecting element $D_j$; and
$d_j$ is a directional derivative of the irradiance distribution of the projection light along the direction at the location of the second beam deflecting element $D_j$.

17. An apparatus, comprising:
an illumination system according to claim 4; and
a projection objective,
wherein the apparatus is a microlithographic projection exposure apparatus.

18. A method of using a microlithographic projection exposure apparatus which comprises an illumination system and a projection objective, the method comprising:
using the illumination system to illuminate a mask comprising a pattern; and
using the projection objective to image at least a portion of the illuminated pattern onto a light sensitive material,
wherein the illumination system is an illumination system according to claim 4.

19. An apparatus, comprising:
an illumination system according to claim 8; and
a projection objective,
wherein the apparatus is a microlithographic projection exposure apparatus.

20. A method of using a microlithographic projection exposure apparatus which comprises an illumination system and a projection objective, the method comprising:
using the illumination system to illuminate a mask comprising a pattern; and
using the projection objective to image at least a portion of the illuminated pattern onto a light sensitive material,
wherein the illumination system is an illumination system according to claim 8.

* * * * *

UNITED STATES PATENT AND TRADEMARK OFFICE
CERTIFICATE OF CORRECTION

PATENT NO. : 9,261,695 B2
APPLICATION NO. : 14/025216
DATED : February 16, 2016
INVENTOR(S) : Michael Patra Page 1 of 1

It is certified that error appears in the above-identified patent and that said Letters Patent is hereby corrected as shown below:

In the Specification

Col. 6, line 4, delete "Na·a," and insert -- $NA \cdot a$, --.

Col. 6, line 5, delete "a" and insert -- $a$ --.

Col. 6, line 65, after "micromirrors;" insert -- and --.

Signed and Sealed this
Fourteenth Day of June, 2016

Michelle K. Lee
*Director of the United States Patent and Trademark Office*